(12) United States Patent
Belousov et al.

(10) Patent No.: US 8,303,713 B2
(45) Date of Patent: Nov. 6, 2012

(54) CHEMICAL VAPOR DEPOSITION FLOW INLET ELEMENTS AND METHODS

(75) Inventors: Mikhail Belousov, Plainsboro, NJ (US); Bojan Mitrovic, Somerset, NJ (US); Keng Moy, Basking Ridge, NJ (US)

(73) Assignee: Veeco Instruments Inc., Plainview, NY (US)

( * ) Notice: Subject to any disclaimer, the term of this patent is extended or adjusted under 35 U.S.C. 154(b) by 398 days.

(21) Appl. No.: 12/631,079

(22) Filed: Dec. 4, 2009

(65) Prior Publication Data
US 2010/0143588 A1 Jun. 10, 2010

Related U.S. Application Data

(60) Provisional application No. 61/201,074, filed on Dec. 4, 2008.

(51) Int. Cl.
C23C 16/00 (2006.01)
C23C 16/455 (2006.01)
H01L 21/306 (2006.01)

(52) U.S. Cl. ............... 118/715; 156/345.33; 156/345.34
(58) Field of Classification Search ................... 118/715; 156/345.33, 345.34
See application file for complete search history.

(56) References Cited

U.S. PATENT DOCUMENTS

| | | | |
|---|---|---|---|
| 4,993,358 A * | 2/1991 | Mahawili | 118/715 |
| 5,545,436 A | 8/1996 | Saito et al. | |
| 5,595,606 A | 1/1997 | Fujikawa et al. | |
| 6,090,210 A | 7/2000 | Ballance et al. | |
| 6,161,500 A | 12/2000 | Kopacz et al. | |
| 6,197,121 B1 | 3/2001 | Gurary et al. | |
| 7,416,635 B2 * | 8/2008 | Moriya et al. | 156/345.34 |
| 8,152,923 B2 * | 4/2012 | Mitrovic et al. | 118/715 |
| 2004/0060514 A1 | 4/2004 | Janakiraman et al. | |
| 2004/0129212 A1 | 7/2004 | Gadgil et al. | |
| 2006/0021574 A1 | 2/2006 | Armour et al. | |
| 2006/0196604 A1 * | 9/2006 | Moriya et al. | 156/345.34 |
| 2007/0248515 A1 | 10/2007 | Tompa et al. | |
| 2008/0092815 A1 * | 4/2008 | Chen et al. | 118/715 |
| 2008/0099147 A1 * | 5/2008 | Myo et al. | 156/345.34 |
| 2008/0173735 A1 * | 7/2008 | Mitrovic et al. | 239/548 |
| 2010/0143588 A1 * | 6/2010 | Belousov et al. | 427/255.28 |
| 2011/0088623 A1 * | 4/2011 | Mitrovic et al. | 118/730 |
| 2011/0091648 A1 * | 4/2011 | Mitrovic et al. | 427/255.23 |
| 2011/0215071 A1 * | 9/2011 | Mitrovic et al. | 216/37 |
| 2012/0027936 A1 * | 2/2012 | Gurary | 427/255.5 |

FOREIGN PATENT DOCUMENTS

| JP | 2003253431 A | 9/2003 |
|---|---|---|
| KR | 20080029198 A | 4/2008 |
| WO | 2008088743 A1 | 7/2008 |

OTHER PUBLICATIONS

International Search Report PCT/US2009/066502, dated Jul. 16, 2010.

* cited by examiner

*Primary Examiner* — Jeffrie R Lund
(74) *Attorney, Agent, or Firm* — Lerner, David, Littenberg, Krumholz & Mentlik, LLP

(57) ABSTRACT

A flow inlet element (22) for a chemical vapor deposition reactor (10) is formed from a plurality of elongated tubular elements (64, 65) extending side-by-side with one another in a plane transverse to the upstream to downstream direction of the reactor. The tubular elements have inlets for ejecting gas in the downstream direction. A wafer carrier (14) rotates around an upstream to downstream axis. The gas distribution elements may provide a pattern of gas distribution which is asymmetrical with respect to a medial plane (108) extending through the axis.

6 Claims, 9 Drawing Sheets

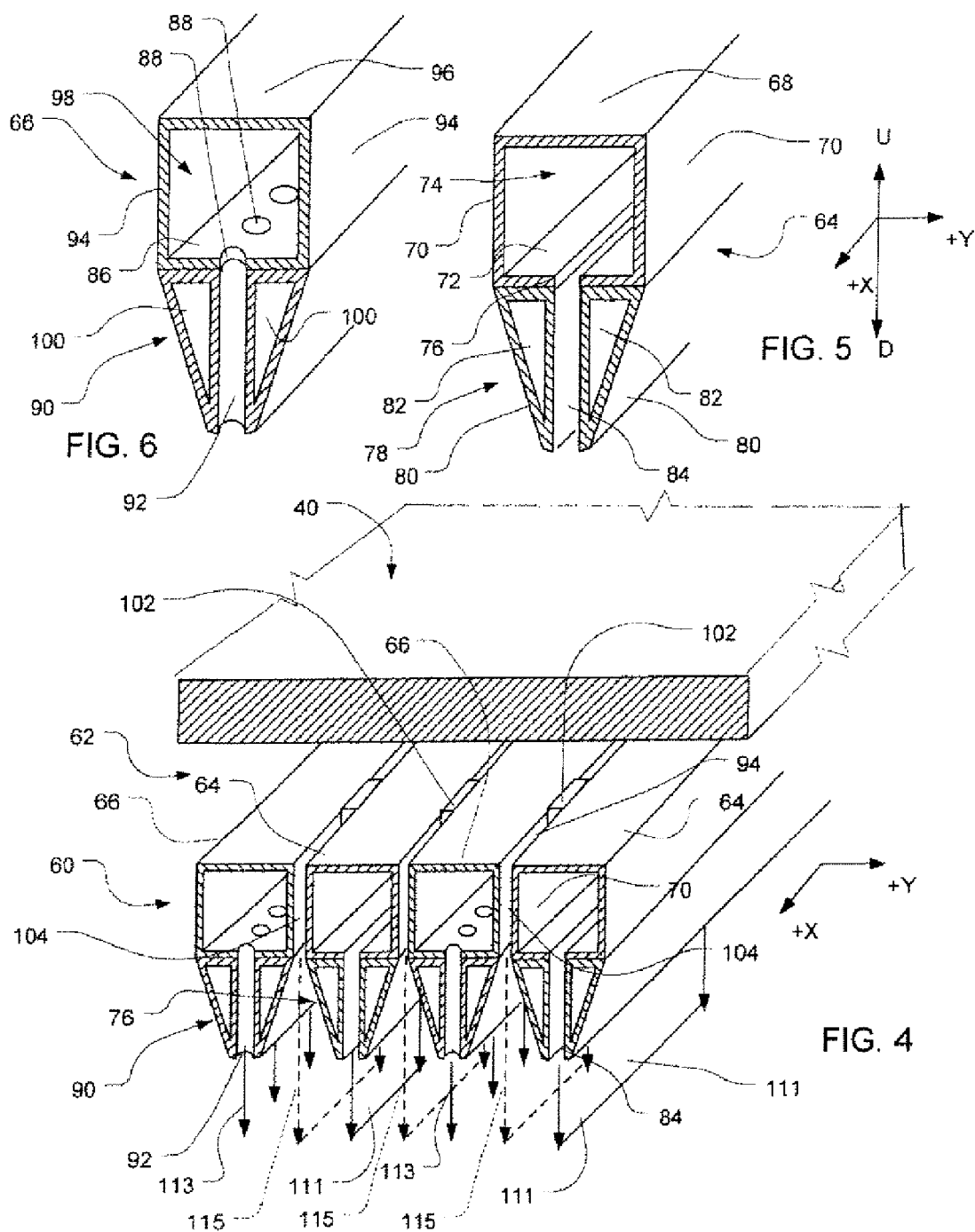

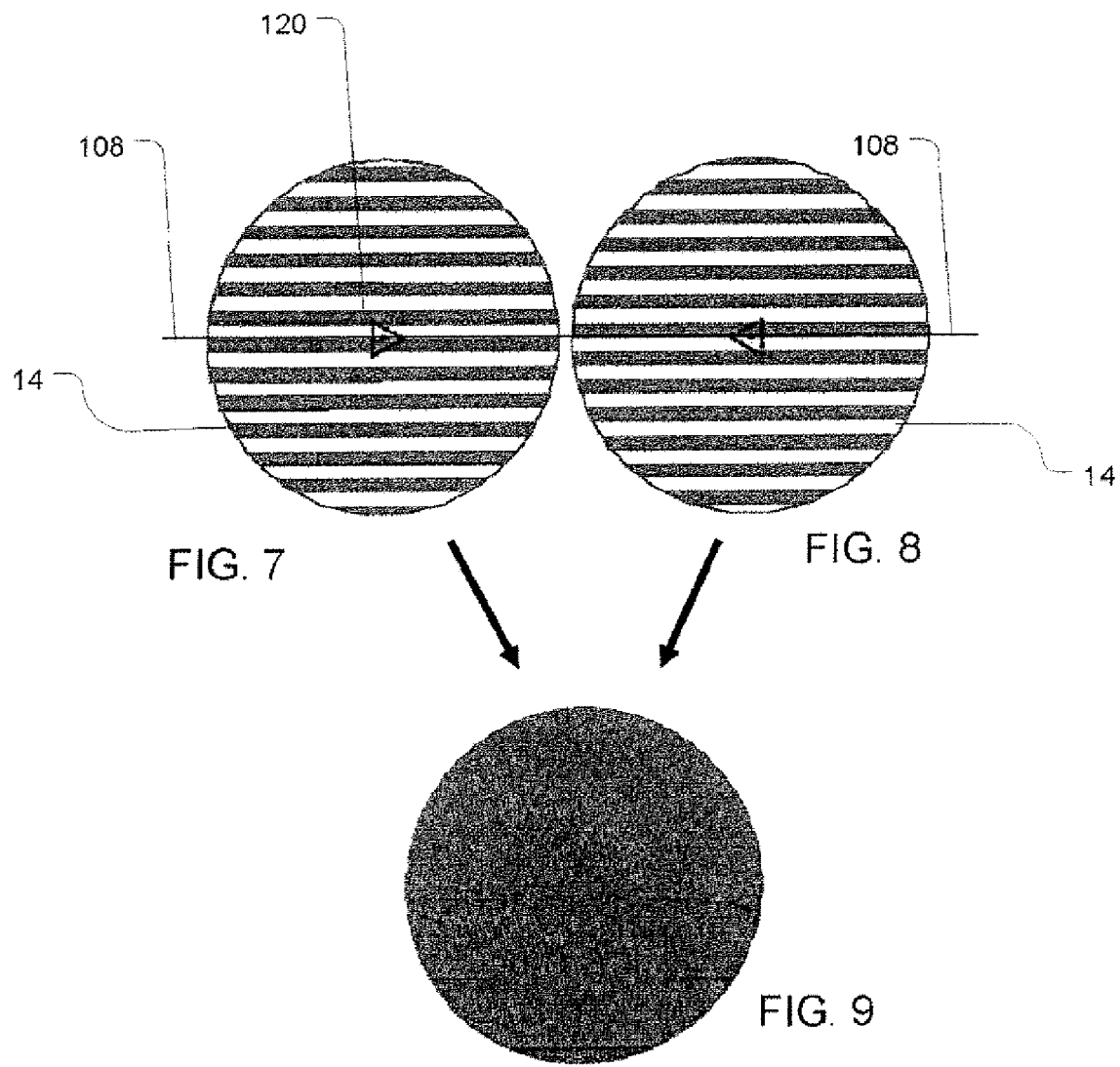

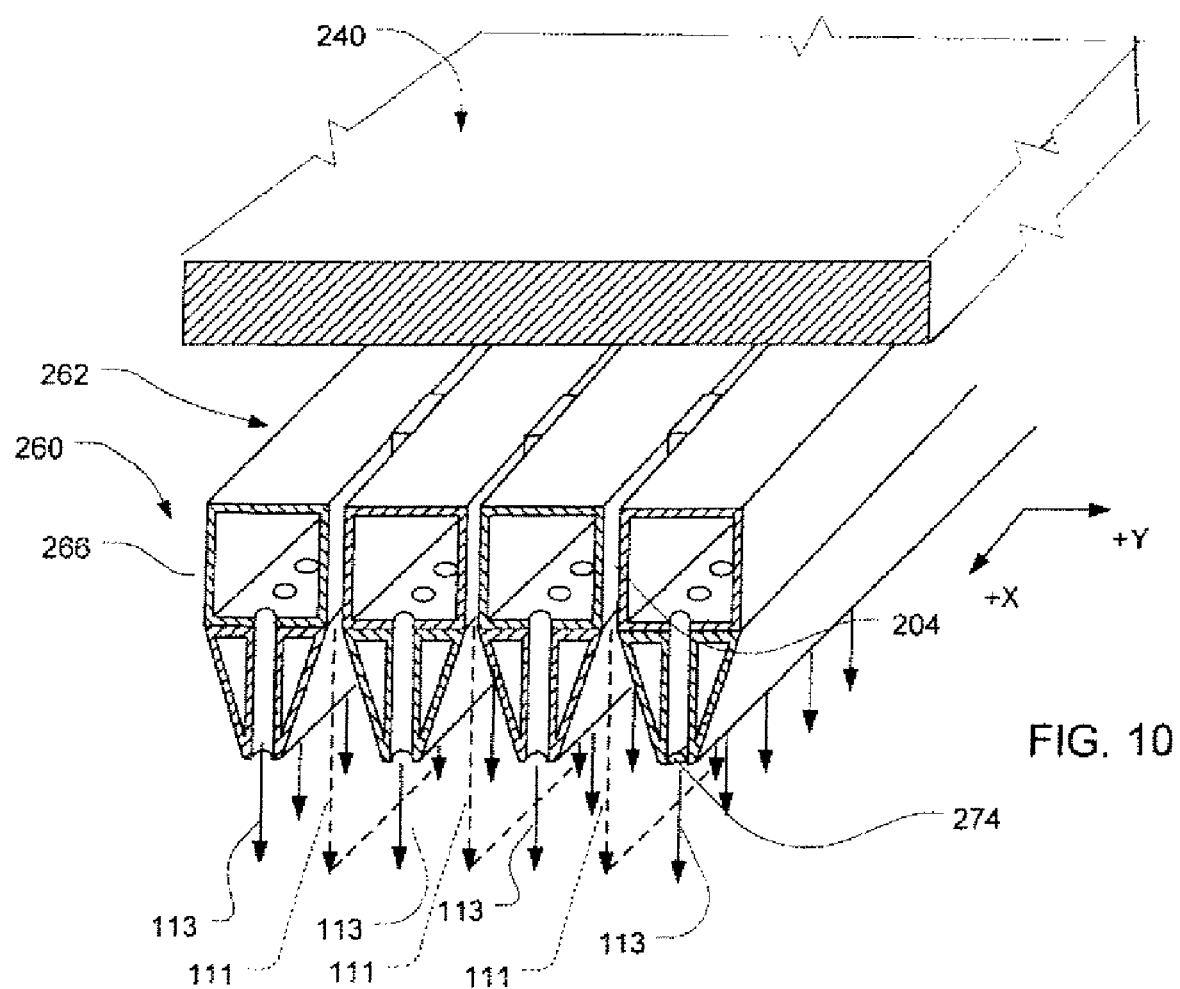

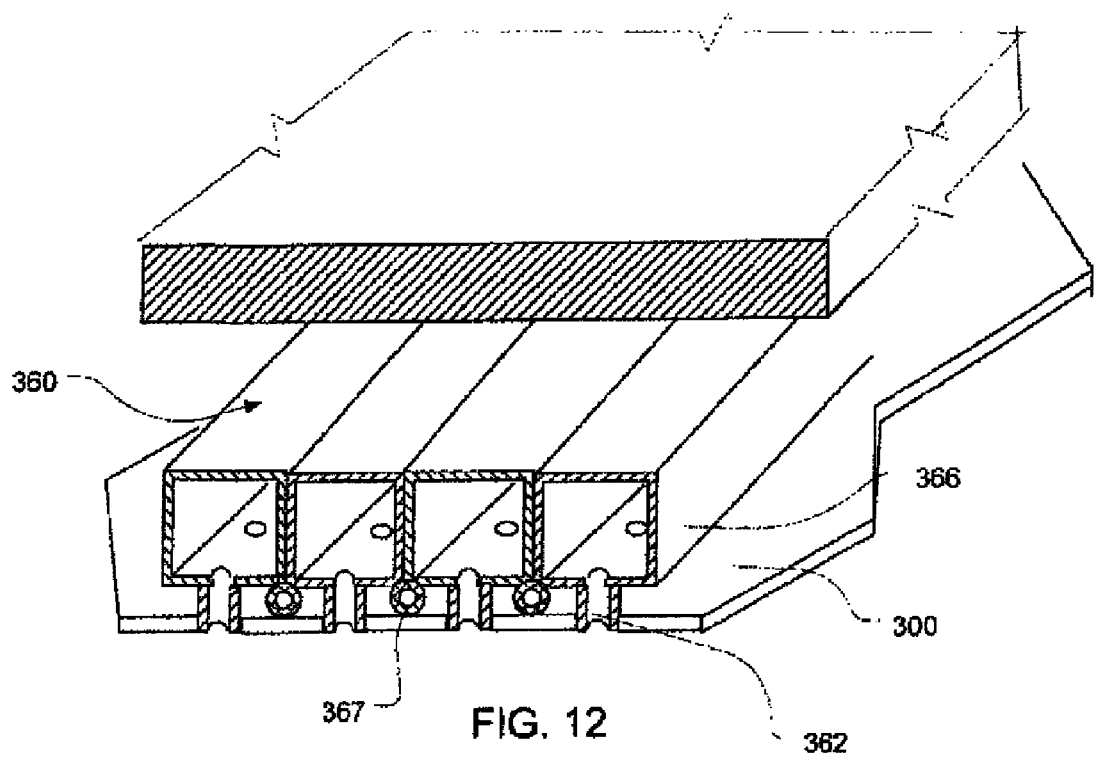
FIG. 12
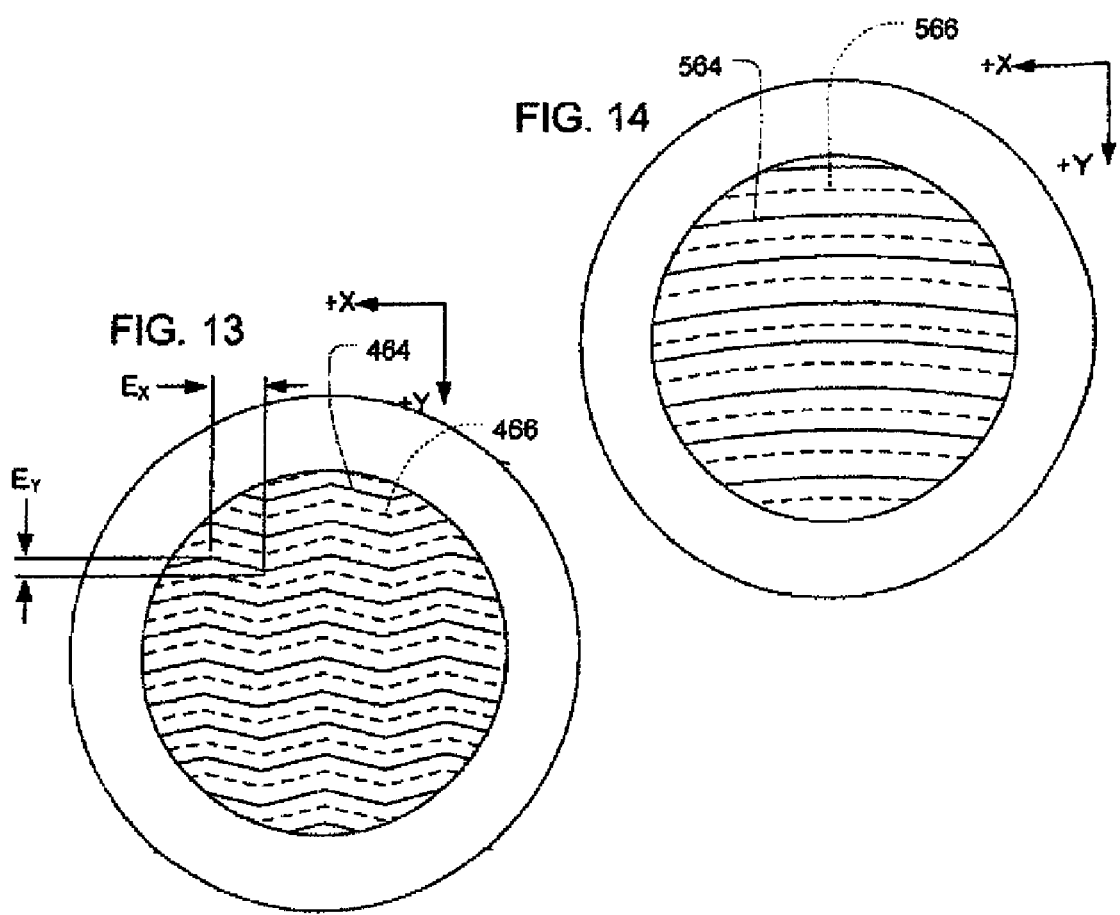
FIG. 13
FIG. 14

CHEMICAL VAPOR DEPOSITION FLOW INLET ELEMENTS AND METHODS

CROSS-REFERENCE TO RELATED APPLICATIONS

This application claims the benefit of the filing date of U.S. Provisional Patent Application No. 61/201,074 filed Dec. 4, 2008, the disclosure of which is hereby incorporated herein by reference.

FIELD OF THE INVENTION

The present invention relates to chemical vapor deposition methods and apparatus.

BACKGROUND OF THE INVENTION

Chemical vapor deposition involves directing one or more gases containing chemical species onto a surface of a substrate, typically a flat wafer, so that the chemical species react and form a deposit on the surface. For example, compound semiconductors can be formed by epitaxial growth of the semiconductor material on a crystalline wafer. Semiconductors referred to as III-V semiconductors commonly are formed using a source of a Group III metal such as gallium, indium, aluminum, and combinations thereof and a source of a Group V element such as one or more of the hydrides or of one or more of the Group V elements such as $NH_3$, $AsH_3$, or $PH_3$, or an Sb metalorganic such as tetramethyl antimony. In these processes, the gases are reacted with one another at the surface of a wafer, such as a sapphire wafer, to form a III-V compound of the general formula $In_X Ga_Y Al_Z N_A As_B P_C Sb_D$, where X+Y+Z=approximately 1, and A+B+C+D=approximately 1, and each of X, Y, Z, A, B, C and D can be between 0 and 1. In some instances, bismuth may be used in place of some or all of the other Group III metals.

In certain processes, commonly referred to as a "halide" or "chloride" process, the Group III metal source is a volatile halide of the metal or metals, most commonly a chloride such as $GaCl_2$. In another process, commonly referred to as metalorganic chemical vapor deposition or "MOCVD," the Group III metal source is an organic compound of the Group III metal as, for example, a metal alkyl.

One form of apparatus which has been widely employed in chemical vapor deposition includes a disc-like wafer carrier mounted within the reaction chamber for rotation about a vertical axis. The wafers are held in the carrier so that surfaces of the wafers face in an upstream direction within the chamber. While the carrier is rotated about the axis, the reaction gases are introduced into the chamber from a flow inlet element upstream of the carrier. The flowing gases pass downstream toward the carrier and wafers, desirably in a laminar plug flow. As the gases approach the rotating carrier, viscous drag impels them into rotation around the axis, so that in a boundary region near the surface of the carrier, the gases flow around the axis and outwardly toward the periphery of the carrier. As the gases flow over the outer edge of the carrier, they flow downwardly toward exhaust ports disposed below the carrier. Most commonly, this process is performed with a succession of different gas compositions and, in some cases, different wafer temperatures, to deposit plural layers of semiconductor having differing compositions as required to form a desired semiconductor device. Merely by way of example, in formation of light emitting diodes ("LEDs") and diode lasers, a multiple quantum well ("MQW") structure can be formed by depositing layers of III-V semiconductor with different proportions of Ga and In. Each layer may be on the order of tens of Angstroms thick, i.e., a few atomic layers.

Apparatus of this type can provide a stable and orderly flow of reactive gases over the surface of the carrier and over the surface of the wafer, so that all of the wafers on the carrier, and all regions of each wafer, are exposed to substantially uniform conditions. This, in turn promotes uniform deposition of materials on the wafers. Such uniformity is important because even minor differences in the composition and thickness of the layers of material deposited on a wafer can influence the properties of the resulting devices.

Considerable effort has been devoted in the art heretofore to development of flow inlet elements for use in apparatus of this type. Commonly, the flow inlet element has inlets for the reactive gases dispersed over an active, gas-emitting area approximately equal in size to the wafer carrier. Some of these flow inlet elements carry the first reactive gas, such as a mixture of a Group V hydride, whereas others carry the second reactive gas, such as a mixture of a metal alkyl and a carrier gas. These inlets may be formed as tubes extending parallel to the axis of rotation, the inlets are distributed over the downwardly-facing or downstream surface of the flow inlet element. Considerable effort has been devoted in the art heretofore to arranging the inlets in symmetrical patterns. Typically, the first gas inlets are provided in a pattern which has radial symmetry about the axis of rotation of the wafer carrier, or which has at least two perpendicular planes of symmetry crossing one another at the axis of rotation. The second gas inlets have been provided in a similarly symmetrical pattern, interspersed with the first gas inlets. The flow inlet element commonly incorporates complex channel structures for routing the gases to the tubular inlets. Moreover, because the wafers typically are maintained at a high temperature as, for example, about 500° C. to about 1200° C., the flow inlet element must be provided with coolant channels. The coolant channels carry a circulating flow of water or other liquid and thus maintain the temperature of the flow inlet element relatively low, so as to limit or preclude premature reaction of the gases. As disclosed, for example, in U.S. Published Patent Application No. 20060021574 A1, the disclosure of which is hereby incorporated by reference herein, a flow inlet element may be provided with additional structures for discharging flows of a carrier gas devoid of reactive species.

The carrier gas flows isolate the reactive gas flows from one another while the gases are in the vicinity of the flow inlet element. The gases do not mix with one another until they are remote from the flow inlet element. Moreover, discharging the carrier gas flows limits or prevents recirculation of the reactive gases as they exit from the flow inlet element. Thus, the reactive gases do not tend to form undesired deposits on the flow inlet element. As described, for example, in commonly assigned U.S. Published Patent Application No. 20080173735 A1, the disclosure of which is hereby incorporated by reference herein, recirculation of the discharged gases in the vicinity of the flow inlet element may be reduced by providing blade-like diffusers projecting downstream from the surface of the flow inlet element to guide the gas flows.

Typically, the inlets are constructed and arranged to provide uniform flow velocity away from the flow inlet element over the entire active region of the flow inlet element, i.e., the entire area where the inlets are arranged. In some cases, the gas inlets for a particular gas may be partitioned into two or more zones, as for example, a first zone near the axis of rotation and a second zone remote from the axis. These two zones may be provided with separate gas channels so that the flow rates of the first gas can be controlled independently in the two regions. For example, in one common arrangement, the inlets for a first gas, such as a Group V hydride, are arranged in an array covering most of the flow inlet surface, whereas the inlets for a second gas, such as a Group III alkyl, are arranged in one or more narrow strips extending generally radially with respect to the central axis. In such a system, a portion of a strip disposed remote from the axis supplies the second gas to a ring-like portion of the wafer carrier having a relatively large area, whereas a portion of the same strip near to the axis supplies the gas to a ring-like portion of the wafer carrier having a smaller area. To provide equal flux of the second gas per unit area of the wafer carrier, it has been common to zone the second gas inlets to provide unequal rates of discharge of the second gas per unit length along the strip. For example, the inlets near the axis may be supplied with a gas mixture having a relatively low concentration of the second gas, whereas the inlets remote from the axis may be supplied with a more concentrated gas mixture. Such zoning adds to the complexity of the system.

Despite all of these developments, still further improvement would be desirable.

BRIEF SUMMARY OF THE INVENTION

One aspect of the invention provides a chemical vapor deposition reactor. The reactor according to this aspect of the invention desirably includes a reaction chamber having upstream and downstream directions, and also desirably includes a carrier support adapted to support a wafer carrier at a carrier location within the reaction chamber for rotation about an axis extending in the upstream and downstream directions. The reactor according to this aspect of the invention preferably has a flow inlet element mounted to the chamber upstream of the carrier location, the inlet element having a gas distribution surface extending in X and horizontal directions perpendicular to one another and perpendicular to the downstream direction.

The flow inlet element desirably has a plurality of elongated gas inlets for discharging gases into the chamber, the elongated gas inlets extending parallel to one another and across the gas distribution surface in the X horizontal direction. The elongated inlets desirably extend across a Y-direction medial plane of the reactor, and may extend across the major portion of the gas distribution surface. For example, the elongated inlets may cover substantially the entire gas distribution surface, or may cover an area approximately equal to the area of the wafer carrier. The elongated gas inlets preferably include a plurality of first gas inlets for discharging a first reactive gas and a plurality of second gas inlets for discharging a second reactive gas, the first gas inlets being spaced apart from one another in the Y horizontal direction, the second gas inlets being spaced apart from one another in the Y horizontal direction and interspersed with the first gas inlets.

The flow inlets may be disposed in a in a pattern which is not symmetrical about a medial plane of the reactor extending in the X horizontal direction. The pattern may be antisymmetrical about such medial plane. That is, for any first gas inlet disposed at a positive Y distance to one side of the X-direction medial plane, a second gas inlet is disposed at the corresponding negative Y distance to the opposite side of the X-direction medial plane.

Still other aspects of the invention provide methods of vapor deposition and flow inlet elements for use in a vapor deposition reactor.

BRIEF DESCRIPTION OF THE DRAWINGS

FIG. 4 is a diagrammatic, partially sectional perspective view depicting certain structures in the element of FIGS. 2 and 3.

FIG. 5 is a diagrammatic, partially sectional view of an enlarged scale of a portion of the structure shown in FIG. 4.

FIG. 6 is a view similar to FIG. 5 but depicting a further portion of the structure shown in FIG. 4.

FIGS. 7, 8, and 9 are diagrammatic representations of gas distribution on a wafer carrier achieved with the apparatus of FIGS. 1-6.

FIG. 10 is a view similar to FIG. 4 but depicting portions of apparatus according to a further embodiment of the invention.

FIG. 12 is a view similar to FIG. 2 but depicting portions of apparatus according to yet another embodiment of the invention.

FIG. 13 is a diagrammatic sectional view of a component used in a still further embodiment of the invention.

FIGS. 14, 15, and 16 are diagrammatic sectional views of components used in still further embodiments of the invention.

DETAILED DESCRIPTION

Figure 1:
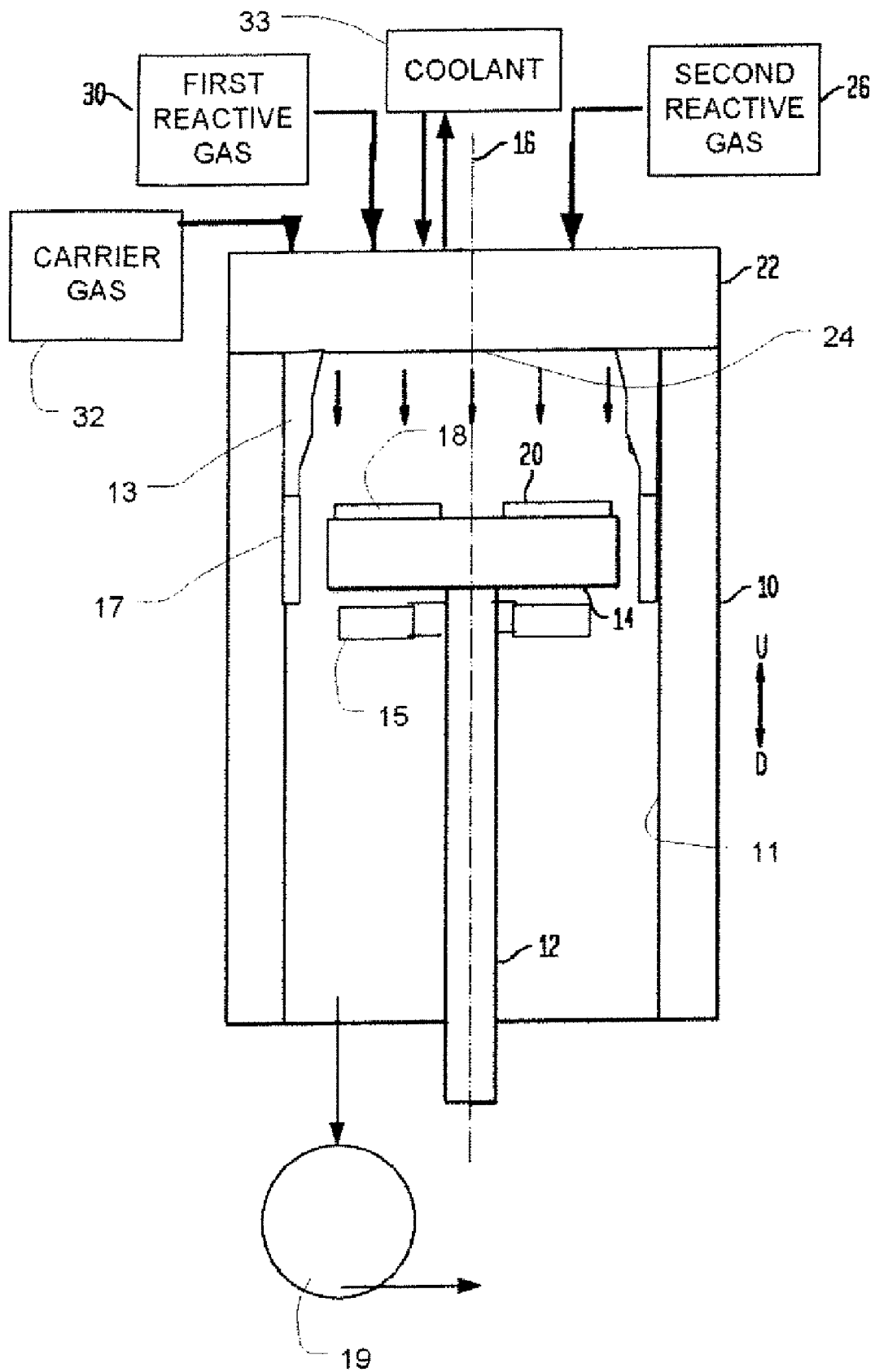
FIG. 1 is a diagrammatic sectional view depicting the deposition apparatus according to one embodiment of the invention.

A reactor according to one embodiment of the invention (FIG. 1) includes a reaction chamber 10 having walls with interior surfaces 11 substantially in the form of surfaces of revolution about a central axis 16. The reactor walls may include a tapering section 13 adjacent an upstream end of the reactor, and also may include a movable hoop-like section 17. A spindle 12 is mounted in the chamber for rotation around axis 16. A disc-like wafer carrier 14 is mounted on the spindle. The wafer carrier 14 is arranged to hold one or more substrates, such as wafers 18, so that surfaces of 20 of the wafers face in an upstream direction U along the axis. Movable wall section 17 forms a shutter which extends around the wafer carrier 14 when the system is in an operative condition as shown. The shutter can be moved axially to open a port for loading and unloading the system. Typically, the wafer carrier 14 is detachably mounted on the spindle, so that the system can be unloaded by removing a wafer carrier and reloaded by inserting a new wafer carrier.

A heater 15 such as an electrical resistance heater is provided within the reactor for heating the wafer carrier and wafers. Also, an exhaust system 19 is connected to the downstream end of the reaction chamber.

The foregoing features of the apparatus may be similar to those used in reactors sold under the trademarks "TurboDisc" and "Ganzilla" by Veeco Instruments, Inc. of Plainview, N.Y.

A flow inlet element 22 is provided at the upstream end of the reaction chamber. A downstream surface 24 of the flow inlet element faces in the downstream direction, toward the wafer carrier and wafers. The flow inlet element is connected to a source of a first reactive gas 30, such as a Group V hydride, typically in admixture with a carrier gas such as $N_2$ or $H_2$. The flow inlet element is also connected to a source 26 of a second reactive gas, such as a metal alkyl, also typically in admixture with a carrier gas. Additionally, the flow inlet element is connected to a source 32 of a carrier gas such as $N_2$ or $H_2$, which is not admixed with any reactive gas, and to a coolant circulation device 33.

Figures 2, 3:
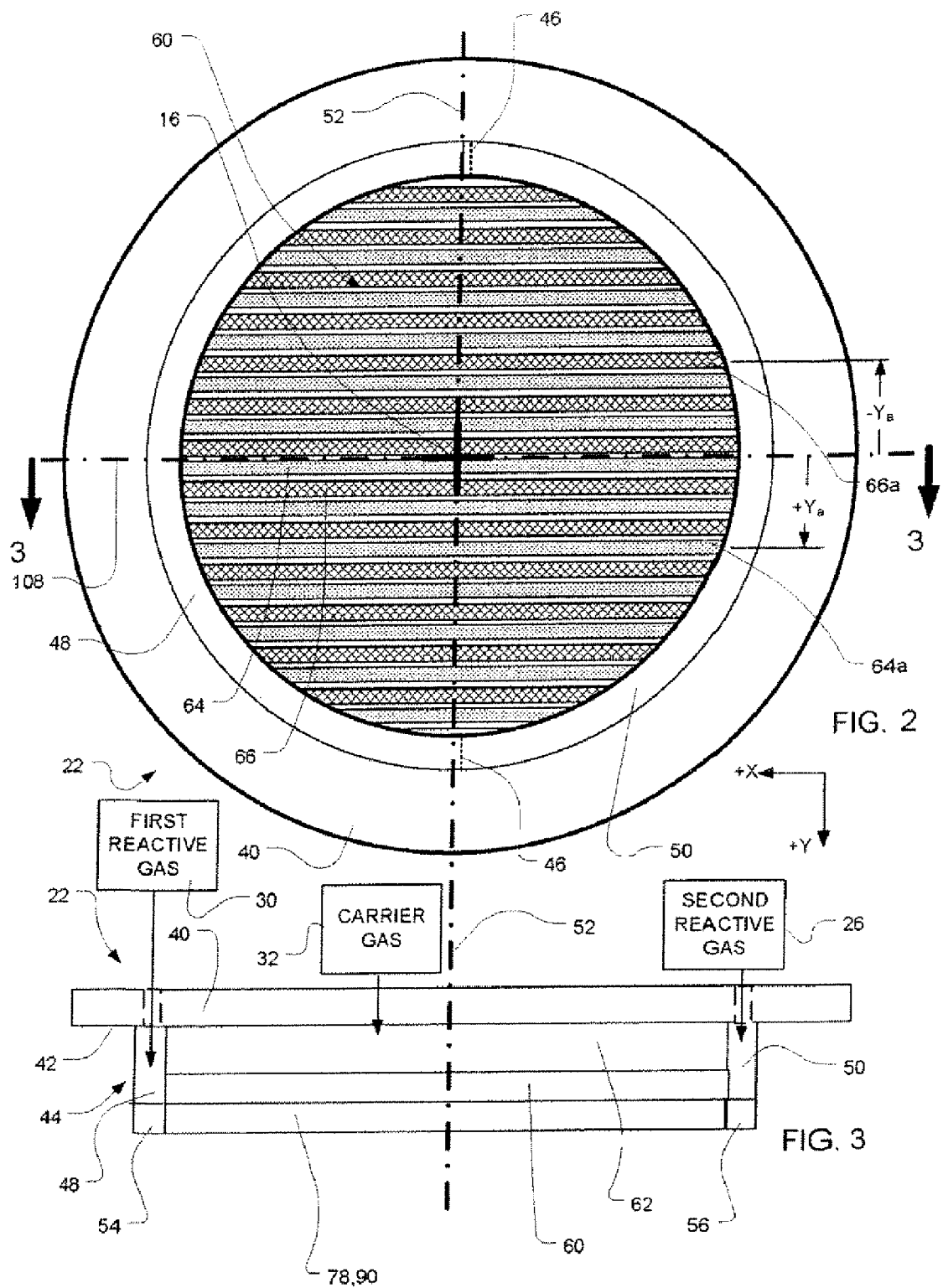
FIG. 2 is a diagrammatic plan view of a component used in the apparatus of FIG. 1.
FIG. 3 is a diagrammatic sectional view taken along line 3-3 in FIG. 2.

As best seen in FIGS. 2 and 3, flow inlet element 22 includes a top plate 40 having a downstream-facing surface 42 and an annular manifold 44 projecting downstream from the downstream surface 42. Manifold 44 is subdivided by internal baffles 46 (FIG. 2) into a first gas section 48 and a second gas section 50. The first gas section 48 and second gas section 50 lie generally on opposite sides of a medial plane 52 which extends through and incorporates the axis 16 of the reactor. The first gas section 48 is connected to the source of first reactive gas 30, whereas the second gas section 50 is connected to the source of the second reactive gas 26 (FIG. 1). These connections may be established through bores extending downwardly through the top plate 40. An annular coolant channel is provided downstream from the gas manifold 48. The coolant channel is subdivided into a coolant inlet section 54 disposed on one side of medial plane 52, and a coolant outlet section 56 disposed on the opposite side of medial plane 52.

The coolant inlet and outlet sections are connected to the coolant circulation apparatus 33 (FIG. 1) by conduits (not shown) extending through the manifold sections 48 and 50.

A gas distribution plate 60 is disposed downstream from the top plate 40 so that plates 60 and 40 cooperatively define a gas distribution chamber 62 between them. The gas distribution chamber 62 communicates with the carrier gas source 32 (FIG. 1), but does not communicate with the first or second gas sections of the manifold.

As best seen in FIG. 4, plate 60 is formed from numerous elongated tubular gas distribution elements 64 and 66 extending parallel to one another. The direction of elongation of the elongated elements 64 and 66 is arbitrarily referred to as the "+X" direction. This direction is a direction perpendicular to the upstream and downstream directions, and perpendicular to the axis 16 of the chamber (FIG. 1). The elongated elements are offset from one another in a "+Y" direction, which is also perpendicular to axis 16 and perpendicular to the +X direction.

Directions perpendicular to the axis 16, including the X and Y directions, are referred to herein as "horizontal" directions inasmuch as axis 16 normally (although not necessarily) extends vertically in the normal gravitational plane of reference. Also, planes which are perpendicular to the axis are referred to herein as horizontal planes. Thus, both top plate 40 and distribution plate 60 extend in horizontal planes. Also, the horizontal direction opposite to the +X direction is referred to herein as the –X direction, and the direction opposite to the +Y direction is referred to herein as the –Y direction, in the conventional manner of a Cartesian coordinate system. The upstream and downstream directions U and D, parallel to axis 16 constitute the third or Z direction of the Cartesian coordinate system.

Tubular elements 64 are referred to herein as first gas distribution elements. As thus seen in FIG. 5, each first gas distribution element incorporates a generally rectangular tubular body having a solid upstream wall 68, solid side walls 70, and a downstream wall 72. Walls 68, 70, and 72 cooperatively define an interior bore 74. The downstream wall 72 has an opening in the form of an elongated slot 76 extending through the wall. Slot 76 extends lengthwise (in the X direction) along the first gas element 64.

An elongated diffuser 78 is mounted on the downstream wall 72 and extends lengthwise along the first gas distribution element 64. Diffuser 78 is generally in the form of a triangular prism. The diffuser is formed from two sections 80, each of which incorporates a passageway 82 extending lengthwise within the diffuser, i.e., in the X directions. Sections 80 are mounted back to back on the downstream wall 72 of the tubular element. Diffuser 80 as a whole is generally in the form of an elongated triangular prism. The width or dimension of the diffuser in the Y directions decreases with distance in the downstream direction D away from the tubular elements. A passageway or additional gas inlet 84 extends through the diffuser 78 from the tubular element to the edge of the diffuser remote from the tubular element, i.e., the downstream edge of the diffuser. The passageway or inlet 84 is in the form of an elongated slot defined by the two back-to-back triangular sections 80 of the diffuser. Passageway 84 communicates with slot 76 and hence with the interior bore 74 of the tubular element along the length of the first gas distribution element 64.

Elements 66, referred to herein as second gas distribution elements, are identical to the first gas elements 64, except that the downstream wall 86 of each second gas distribution element (FIG. 6) has a series of holes 88 arranged along the length of the element instead of the slot 76 of the first gas distribution elements. Also, the diffuser 90 of each second gas distribution element has a series of small tubular inlet ports 92, one of which is visible in FIG. 6 extending through the diffuser and communicating with the holes 88. Each of the passages or inlet ports 92 is open at the downstream edge of the diffuser 90. Here again, each tubular element has an upstream wall 96 and sidewalls 94 so that the downstream wall 86 and the other walls 94 and 96 cooperatively define an interior bore 98 extending lengthwise within the element. Here again, each diffuser has coolant passages 100, also extending lengthwise. The numerous individual inlets 92 provided along the length of element 66 cooperatively define an elongated inlet. Thus, as used in this disclosure, references to an elongated inlet should be understood embracing both an elongated unitary slot such as the slot 76 of element 64, and also embracing an elongated inlet formed from plural individual inlets arranged in a row.

As seen in FIG. 4, the first and second gas distribution elements 64 and 66 are arranged side by side and are mechanically attached to one another as by welds 102 extending between the sidewalls 94 and 70 of mutually adjacent elements. The upstream walls 94 and 68 of the elements cooperatively define an upstream surface of the plate 60, whereas the downstream walls 72 and 86 cooperatively define the downstream surface of the plate. The welds 102 are arranged only at spaced-apart locations along the lengths of the elements. Thus, slot-like inlet openings 104, referred to herein as "base" inlets, extend through the plate from its upstream surface to its downstream surface, between the adjacent gas distribution elements 64 and 66. The upstream surface of the gas distribution plate 60 confronts the space 62 between plate 60 and top plate 40.

As best seen in FIGS. 2 and 3, the composite plate 60 is mounted to the manifold 44 and extends entirely across the circular area enclosed by the manifold. Thus, plate 60 entirely occupies a circular region referred to herein as the active or gas-emitting region of the flow inlet element. This circular region is coaxial with axis 16. The first gas distribution element 64 and second gas distribution element 66 extend in the X horizontal directions, i.e., the directions parallel to a medial plane 108 which also extends in the X direction. The first and second gas distribution elements 64 and 66 extends physically between the first gas section 48 and second gas section 50 and are mechanically connected to both sections, as for example, by welding. However, the interior bores of the first gas distribution elements 64 communicate only with the first gas section 48, whereas the interior bores of the second gas distribution elements 66 communicate only with the second gas section 50. The coolant channels 82, 100 (FIGS. 5 and 6) incorporated in the diffusers 78, 90 are open at both ends and are connected to the coolant inlet section 54 and coolant outlet section 56 (FIG. 3).

As best seen in FIG. 2, each of the individual gas distribution elements 64 and 66 extends in the X direction across the medial plane 52 which extends perpendicular to the X direction. The elongated inlets defined by the individual gas distribution elements also extend across medial plane 52. In this embodiment, each gas distribution element, and the elongated inlets defined by each gas distribution element, extends across substantially the entire span of the active gas distribution region of the flow inlet element. The first and second gas distribution elements 64 and 66 are not arranged symmetrically with respect to the medial plane 108 extending in the X direction. Rather, the first and second gas distribution elements 64, 66 are arranged within an antisymmetrical or negative-symmetry pattern with respect to medial plane 108. That is, for each first gas distribution element 64 arranged at a positive or +Y difference from medial plane 108, there is a second gas distribution element 66 arranged at the corresponding −Y distance from medial plane 108. For example, first gas distribution element 64$a$ is disposed at distance +$Y_a$ from medial plane 108. Second gas distribution element 66$a$ is disposed at the corresponding, negative distance −$Y_a$ of equal magnitude from the same medial plane. The distance to each gas distribution element is measured to the longitudinal center line of the inlets defined by such element as, for example, the longitudinal center line of slot-like inlets 84 (FIG. 6) or the longitudinal center line of the rows of holes 92 (FIG. 6). In the depiction of FIG. 2, the spaces or base gas inlets 104 between the gas distribution elements are omitted for clarity of illustration.

In operation, a first reactive gas such as a mixture of ammonia or other Group V hydride in admixture with one or more carrier gases such as $H_2$, $N_2$ or both is supplied through the first gas section 48 of the manifold and passes into the longitudinal bores 74 (FIG. 5) of the first gas distribution elements 64. The first reactive gas thus issues as a series of elongated, curtain-like streams of gas 111 (FIG. 4) from the inlets 34 defined by the first gas distribution elements 64 and associated diffusers 78. Similarly, a second reactive gas, such as a metal alkyl in admixture with a carrier gas, is supplied through the second gas section 50 (FIG. 2) of the manifold and passes through the interior bore 98 (FIG. 6) of the second gas distribution element 66. The second gas thus issues as rows of streams 113 (FIG. 4) from the inlets 92 defined by the second gas distribution elements and the associated diffusers. These rows of gas streams 113 are interspersed between the streams 111 of the first gas. A carrier gas such as $H_2$, $N_2$ or a mixture thereof is introduced into the carrier gas space 62 and passes through the spaces or base openings 104 defined between the gas distribution elements 64 and 66 constituting the plate. The carrier gas thus issues as curtain-like streams 115 interposed between each stream 111 of the first reactive gas and the adjacent rows of streams 113 of the second reactive gas. The streams of gases travel downstream to the vicinity of the wafer carrier 14 and the wafers 18, where they are swept into rotational flow by the rotational motion of the wafer carrier and wafers. The first and second reactive gases react with one another at the wafer surface to form a deposit as, for example, a III-V semiconductor.

The first and second reactive gases remain substantially separate from one another while they are in the vicinity of the flow inlet element and flow downstream from the flow inlet element in a substantially laminar, orderly flow. Several factors contribute to this action. The diffusers 90 and 76 define generally V-shaped channels between them, such channels being disposed downstream of the base inlets 104. The channels broaden gradually in the Y horizontal direction with distance downstream from the base inlets 104. This facilitates spreading of the carrier gas flows 115 in an orderly fashion, so that a substantially laminar carrier gas flow prevails at the downstream edges of diffusers 76 and 90. The first and second reactive gas flows 111 and 113 are introduced into this flow regime at the downstream edges of the diffusers and thus tend to flow in a similar orderly laminar flow. Moreover, the carrier gas flows 115 provide substantially complete isolation between the first reactive gas flows 111 and the second reactive gas flows 113. Stated another way, a path in a horizontal plane, transverse to the upstream-to-downstream axis 16, which path extends from one of the second reactive gas flows 113 to an adjacent first reactive gas flow 111 would intercept one of the carrier gas flows 115. This is true for any curve drawn in a horizontal plane, which is confined within the active area of the flow inlet element, i.e., the area where gas inlets are present. This substantially complete isolation between the first and second reactive gas flows minimizes premature reaction between the gases.

The flows of first and second gases are not symmetrical about the medial plane 108 extending in the X direction. If the wafer carrier and wafers were static, this would result in nonuniform exposure of the wafer carrier and wafers to the first and second reactive gases. For example, as schematically depicted in FIG. 7, a wafer carrier 14 is shown with a marker 120 on the carrier provided for purposes of illustration pointing in the fX direction, to the right in FIG. 7. If the wafer carrier were to remain in this orientation, the region shown as dark stripes would be heavily impacted by the first reactive gas, whereas the region shown as light stripes would be more heavily impacted by the second reactive gas. The same pattern of impact areas is shown in FIG. 8, but with the wafer carrier 14 rotated 180° about the central axis 16, so that the indicator 120 points in the opposite or −X direction. The pattern of light and dark stripes in FIG. 8 is the reverse of the pattern in FIG. 7. Thus, as the wafer carrier rotates, the regions which were heavily exposed to the first gas in one orientation of the wafer carrier will be heavily exposed to the second gas in the opposite orientation of the wafer carrier. With continual rotation of the wafer carrier, the exposure pattern becomes uniform as shown in FIG. 9.

In this arrangement, each unit length along one of the elongated first gas distribution elements 64 (FIG. 2) supplies the first gas to an area of the same size on the wafer carrier. Likewise, each unit length along one of the elongated second gas distribution elements 66 (FIG. 2) supplies the second gas to an area of the same size on the wafer carrier. Therefore, substantially uniform flux of the first and second gases on the wafer carrier can be provided if all of the first gas distribution elements 64 are arranged to the same mass flow rate of the first gas per unit length along their entire lengths, and all of the second gas distribution elements 66 are arranged to provide the same mass flow rate of the second gas per unit length along their entire lengths. The mass flow rate of the first gas per unit length desirably is uniform over the entire length of each elongated slot 84 (FIG. 5). Also, the mass flow rate of the second gas desirably is uniform over the entire length of each elongated inlet defined by a row of discrete inlets ports 92 (FIG. 6). There is no need to provide multiple zones of first gas inlets or multiple zones of second gas inlets with different volume flow rates per unit length or different concentrations of the first or second gasses. This significantly simplifies the construction and operation of the system. Moreover, such simplicity is provided without the complex structures commonly used to provide uniform arrays of gas inlets. To assure that the mass flow rate is uniform along the length of each flow inlet element 64 or 66, the flow resistance along the length of the element, through bore 74 or 98, desirably is small in comparison to the flow resistance from the bore through inlets 84 and 92.

It should be appreciated that the impact patterns shown in FIGS. 7 and 8 are schematic patterns provided for illustration only. In actual practice, the gases flowing downstream themselves are swept into rotational motion about the axis. The rotational motion of the gases tends to make the pattern of exposure to the gases at any given rotational position of the wafer carrier more uniform than those shown in FIGS. 7 and 8.

The structure and method of operation discussed above can be utilized in reaction chambers of essentially any size. The structure can be scaled up to relatively large sizes as, for example, reactors having a wafer carrier of about 600 mm or more and having a flow inlet element with an active, gas-emitting region of approximately the same diameter or more. Moreover, the flow inlet element can be fabricated readily.

Numerous variations and combinations of the structures discussed above can be employed. In a variant of the arrangement discussed above, the first gas distribution elements 64 may be used to supply flows of carrier gas, whereas the base inlets 104 may be used to supply flows of a reactive first gas and the second gas distribution elements may be used to supply a reactive second gas. In still other variants, more than two reactive gasses may be used. For example, the gas distribution elements may include first, second and third gas distribution elements extending generally parallel to one another.

In a further variant shown in FIG. 10, the gas space 262 between the gas distribution plate 260 and the top plate 240 of the flow inlet element is connected to the source of first reactive gas as, for example, ammonia, so that the flows of gas issuing through the base inlets 204 between the gas distribution elements of the plate are flows 111 of the first reactive gas. In this embodiment, all of the gas distribution elements 266 constituting plate 260 are configured in the same way as the second gas distribution elements 66 discussed above. Thus, flows 113 of the second reactive gas issue from the additional inlets 274 at the edges of all of the diffusers. In other variants, all of the flow inlet elements are configured with slit-like inlets such as those used in the first gas distribution elements 64 discussed above. Even where no separate carrier gas flow is used to provide separation between the first and second gases, ejection of the second reactive gas 113 at the tips of the diffusers, within the smooth flow laminar of first reactive gas 111 facilitated by the diffusers provides good reassurance against recirculation of the gases and deposition of unwanted by-products on the flow inlet element.

Figure 11:
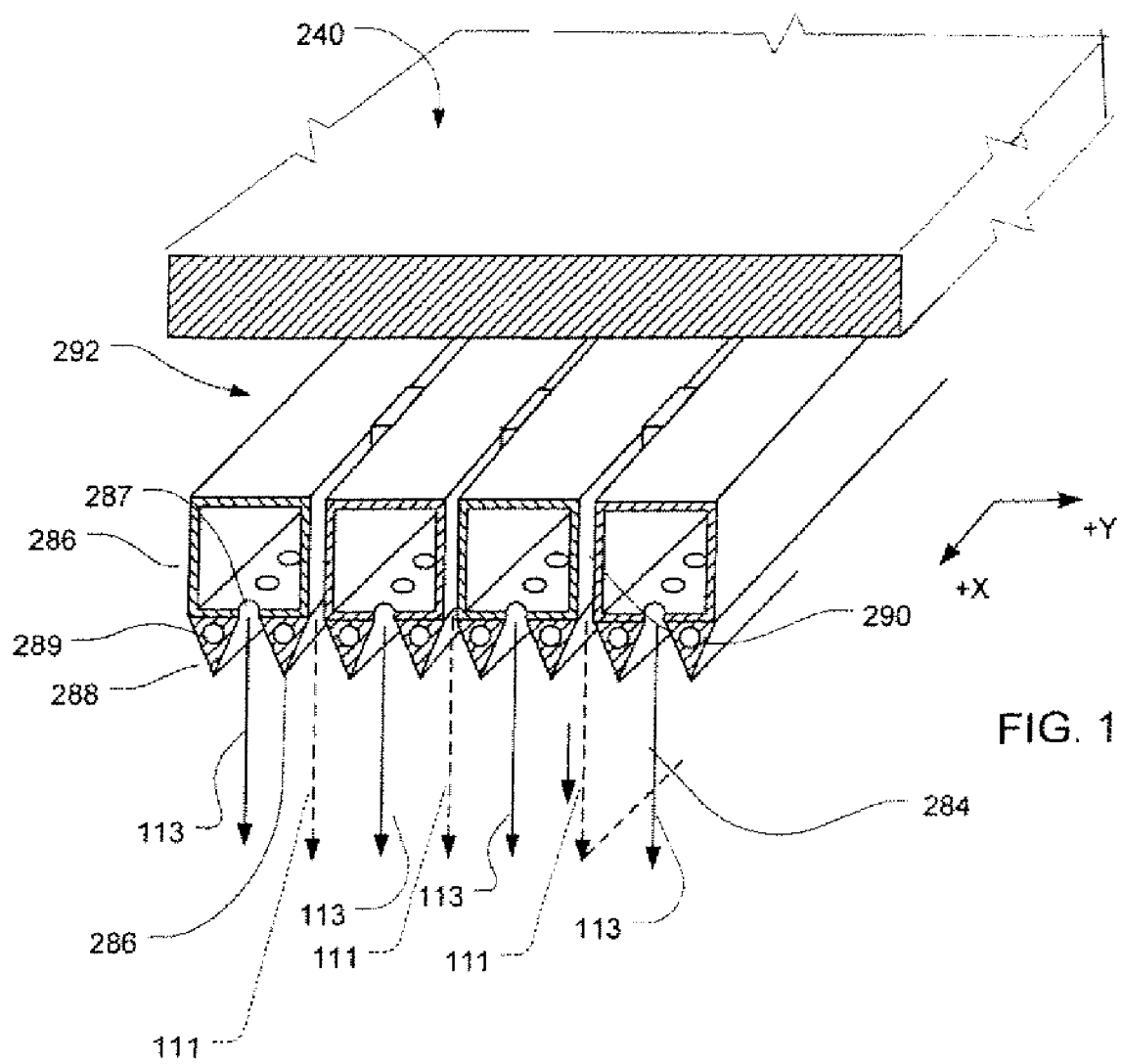
FIG. 11 is a further view similar to FIG. 4 but depicting apparatus according to yet another embodiment of the invention.

In another embodiment (FIG. 11), each gas distribution element includes a tubular body 286 which defines an elongated gas inlet in the form of a row of holes 287 open at the downstream face of the tubular body. Each elongated gas distribution element has two diffusers 288 mounted to the downstream face of the tubular body so that the two diffusers lie on opposite sides of the elongated inlet. Here again, the gas distribution elements are attached to one another but spaced apart from one another so as to define base inlets 290 between them. In this embodiment, the inlets defined by the rows of holes 287 in the gas distribution elements, as well as the base inlets 290 open to the reaction chamber at the downstream surfaces of the tubular bodies 286, so that the openings of the all of the inlets are disposed in the same plane. In this arrangement, a diffuser 288 is disposed between each inlet 287 defined by the gas distribution element and the adjacent base inlet 290. Here again, the gas space 292 between the top plate 240 and the composite plate formed by the gas distribution elements is connected to a source of a first gas, whereas the gas distribution elements are connected to a source of a second gas, so that first gas flows 111 issue from the base inlets 290 and second gas flows 113 issue from the inlets 287 defined by the gas distribution elements. In this embodiment as well, the smooth laminar flow facilitated by the diffusers inhibits recirculation and deposit formation. In this embodiment as well, the diffusers desirably are provided with coolant passages 289. In further variants, some or all of the elongated inlets defined by the gas distribution elements may be slots rather than rows of holes. Here again, the gases may include a carrier gas in addition to the first and second gases.

In yet another variant, the diffusers mounted on the downstream surface of the gas distribution plate may be omitted. In a still further variant, a porous screen may be provided over the downstream surface of the composite plate except at the inlets. In yet another arrangement (FIG. 12), the tubular gas distribution elements 360 are mounted side by side in abutting relationship with one another and fastened together as, for example, by welding. In this arrangement, there are no base inlets extending through the gas distribution plate formed by the gas distribution elements 366. A porous screen 300 is mounted downstream from plate 360, and the inlets 364 of the various gas distribution inlets are provided with short tubes extending downstream through the screen. A carrier gas may be introduced into the space 363 between the composite plate 360 and the screen 300, so that the carrier gas flows through the screen and surrounds each of the streams of reactive gases issuing from the inlets 362. Cooling channels 367 may be provided in this embodiment on the bottom surfaces of the individual gas distribution elements.

In the embodiments discussed above, the gas distribution plate is formed from separate elongated gas distribution elements joined to one another. However, the gas distribution plate also can be formed from one or more unitary plates defining elongated inlets similar to those discussed above.

In the embodiments discussed above, the elongated gas inlets are straight. However, this is not essential. For example, in the embodiment of FIG. 13, each elongated first gas inlet 464, represented schematically by a solid line, extends in a zig-zag pattern. Thus, each such inlet extends generally in the X directions, with minor deviations in the Y direction. The elongated second gas inlets 466, represented schematically by broken lines, extend in a similar zig-zag pattern. The base inlets (not shown) may also have a similar zig-zag configuration. In this arrangement as well, the first and second gas inlets extend generally parallel with one another. However, each elongated gas inlet still extends generally in the X direction. Stated another way, over any substantial extent Ex of a gas inlet in the X directions, the extent of such inlet Ey in the Y direction is small in comparison to Ex. In a further variant (FIG. 14), the elongated gas inlets 564 and 566 are in the form of arcs rather than straight lines. Here again, the gas inlets extend generally in the X direction.

Figure 15:
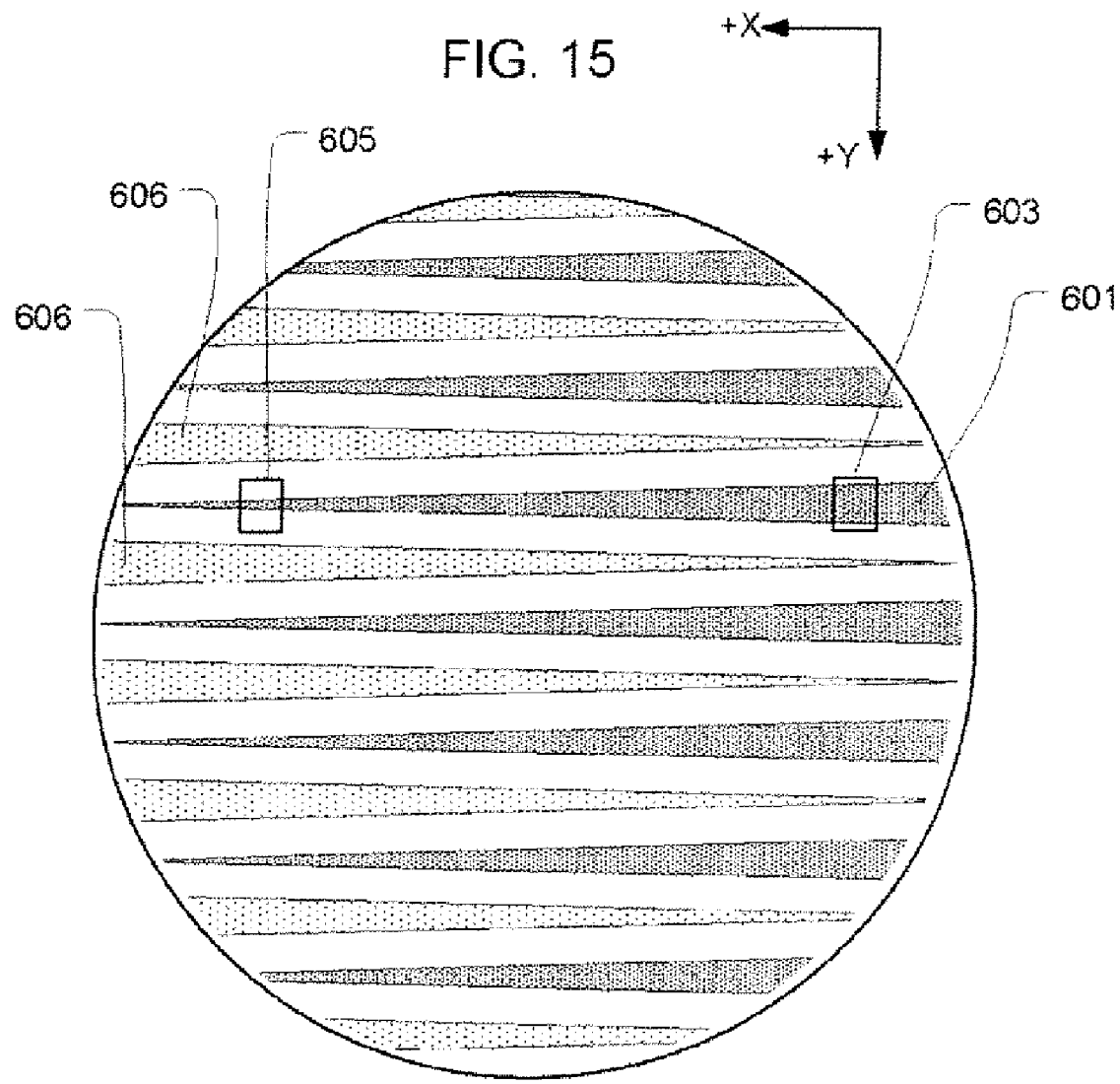

In the embodiments discussed above, each elongated gas inlet provides the same mass flow rate of a reactive gas per unit length along its entire length. In a variant, the mass flow rate of the reactive gas per unit length may vary progressively along the length of the elongated gas inlet. This may occur, for example, where a particular elongated gas distribution element receives a gas mixture at only one end, and has appreciable resistance to flow along its length. FIG. 15 schematically depicts the impact pattern 601a of a first reactive gas flowing from such an elongated inlet. In this case, the mass flow rate of the reactive gas from the particular inlet diminishes progressively in the +X direction along the length of the inlet. Thus, the breadth of the area on the wafer carrier impacted by the gas is shown as diminishing in the +X direction. In the arrangement of FIG. 15, the second reactive gas inlets 606 have mass flow rates which diminish in opposite, −X direction. Rotation of the wafer about the central axis will cancel out the differences in the impact patterns. For example, a portion of the wafer which is aligned with portion 603 of impact pattern 601a will be aligned with portion 605 when the wafer carrier rotates one half turn. In yet another arrangement, alternate ones of the first gas inlets may have mass flow rates, and hence impact patterns, which diminish in opposite X directions. The second gas inlets may have a similar arrangement.

In the embodiments discussed above, the first and second gas inlets are provided in equal number and arranged in 1:1 alternating order in the Y direction. However, this is not essential. For example, 2, 3 or more elongated first gas inlets may be provided between each pair of second gas inlets.

Also, it is not essential to place the elongated gas inlets in exact anti-symmetrical arrangement about the medial plane extending in the X direction. Deviations from this arrangement, up to and including a symmetrical arrangement, can be used. Also, in the embodiments discussed above, the plate defining the elongated gas inlets includes elongated tubular gas distribution elements. However, elongated gas inlets may be provided by other structures as, for example a one or more unitary plates having appropriate gas distribution channels or chambers communicating with the inlets.

A chemical vapor deposition apparatus according to a further embodiment of the invention (FIG. 16) includes a reaction chamber 710 which is generally in the form of a hollow body of revolution about a central axis 716. As in the embodiment discussed above with reference to FIG. 1, the apparatus includes a support such as a spindle (not shown) adapted to support a wafer carrier (not shown) for rotation about central axis 716. In this embodiment, the flow inlet element 722 defines first gas inlets 764, represented schematically by solid lines in FIG. 16, and second gas inlets 766, represented schematically by dashed lines. The first gas inlets are connected to a source of a first reactive gas, as, for example, a gas mixture containing a Group III element, whereas the second gas inlets are connected to a source of a second gas reactive with the first gas, such as a gas mixture containing a Group V element. The gas inlets also include third gas inlets 768, schematically shown as dotted lines in FIG. 16. The third gas inlets are connected to a source of a carrier gas which is substantially non-reactive with the first and second gases under the conditions prevailing within the chamber.

The first gas inlets extend only within a region of the gas distribution surface having a first radius $R_1$ from the central axis 716. Stated another way, the first gas outlets extend to a first radius $R_1$ from the central axis. The second gas outlets extend to a second radius $R_2$ from the central axis, which in this embodiment is equal to the first radius P. The third gas inlets extend to a radius $R_3$ which is greater than the first and second radii, and hence greater than $R_1$ and $R_2$. In the particular example depicted, the radius $R_3$ is equal to, or just slightly less than, the interior radius of the reaction chamber at the gas distribution surface. The first and second radii $R_1$ and $R_2$ may be approximately equal to the radius of the wafer carrier.

In operation, the gasses issuing from the first and second gas inlets will pass downstream (in the direction along axis 716 toward the viewer in FIG. 16) to the wafer carrier and participate in chemical vapor deposition reactions or other treatment of the wafers carried on the carrier. In the region within first and second radii $R_1$ and $R_2$, the carrier gas issuing from the third gas inlets passes downstream between the streams of first and second gasses, and maintains separation between these streams for at least part of the distance from the flow inlet element to the wafer as discussed above. In the gap region G outside of the region occupied by the first and second gas inlets, the carrier gas issuing from the third gas inlets forms a curtain which keeps the reactive first and second gasses isolated from the wall of chamber 710. This minimizes deposition of reaction products on the chamber walls. In particular, recirculation of gases can occur at the upstream end of the chamber where the flow inlet element 722 joins the reactor wall. With the arrangement shown in FIG. 16, any recirculating gases will be composed essentially of the carrier gas, and therefore will not tend to form deposits on the reactor walls or flow inlet element.

Moreover, omission of the first and second inlets in the gap region G reduces the required total flow of the first and second reactant gases to maintain a given flux of reactants toward the wafer carrier. Stated another way, if first and second reactive gasses were provided in the gap region G, they would simply pass around the outside of the wafer carrier, without ever impinging on the wafers. Avoiding this waste reduces the cost of reactant gases used in the process, and also reduces discharge of waste reactant gases.

Figure 16:
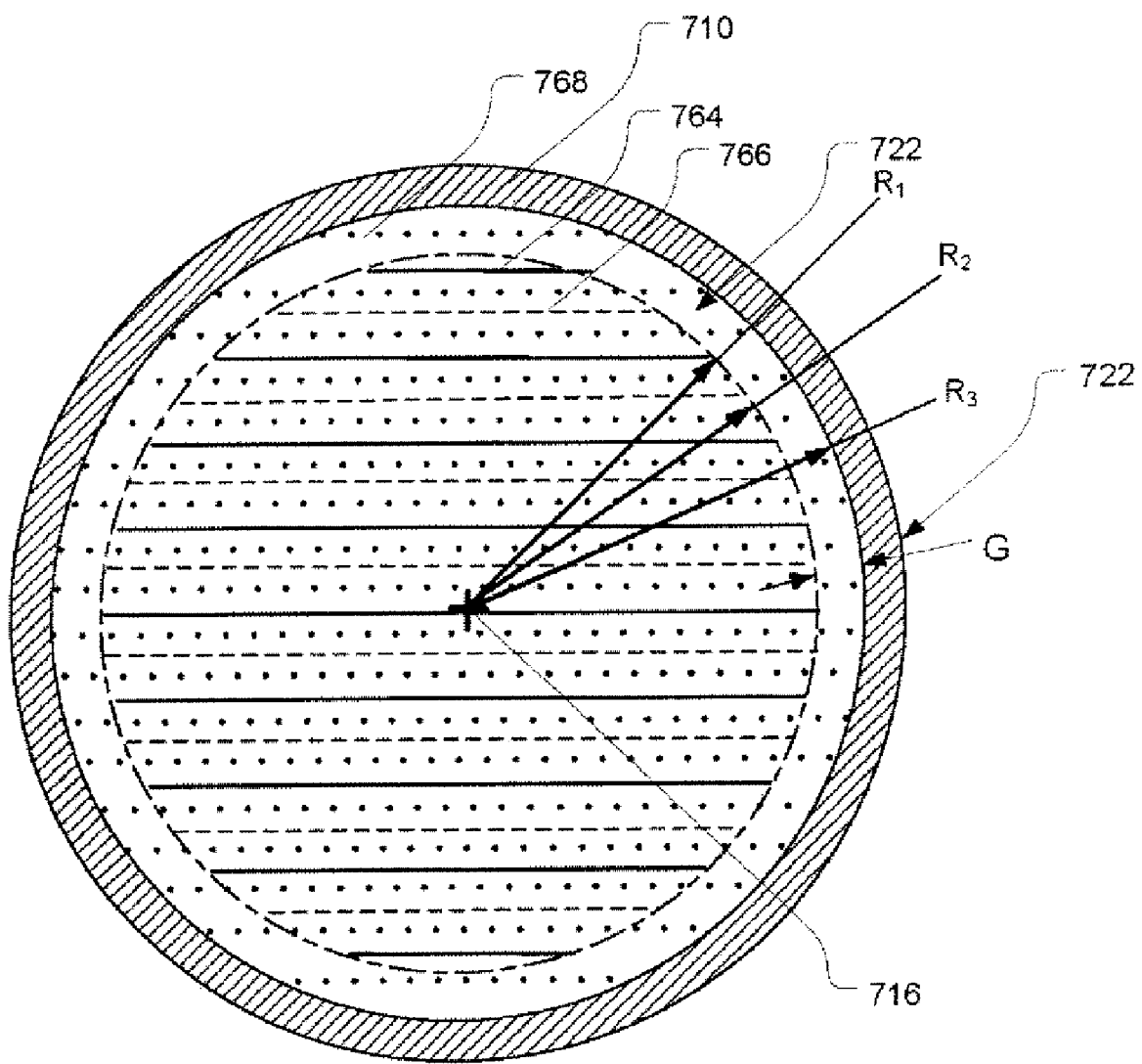

The arrangement shown in FIG. 16 may be varied. For example, the first and second radii $R_1$ and $R_2$ may differ from one another. One of these radii may be as large as, or even greater than, the third radius $R_3$. In such an arrangement, the curtain of gas adjacent the reactor wall would include the carrier gas and only one of the reactant gases. Such a curtain would still be effective to suppress deposition at the chamber wall. It is not essential to provide third gas inlets between the first and second gas inlets. For example, the third gas inlets may be provided only in the gap region G. Also, the gas inlets are shown in FIG. 16 as disposed in parallel rows, but other configurations can be used. For example, the first gas inlets can be in the form of a "field" or continuous area, whereas the second gas inlets can be in the form of one or more radial rows.

As these and other variations and combinations of the features discussed above can be utilized without departing from the present invention, the foregoing description of the preferred embodiments should be taken only by way of illustration and not by way of limitation of the present invention.

INDUSTRIAL APPLICABILITY

The present invention can be applied, for example, in manufacture of semiconductor devices.

The invention claimed is:
1. A flow inlet element for a chemical vapor deposition reactor comprising a structure having a downstream side and defining a downstream direction away from the downstream side, the structure defining a plurality of elongated base gas inlets open in the downstream direction and extending parallel to one another in an X horizontal direction perpendicular to the downstream direction, the base gas inlets being spaced apart from one another in a Y horizontal direction perpen- dicular to the X horizontal direction, the structure further including a plurality of elongated diffusers projecting downstream from the base gas outlets extending parallel to one another in the X horizontal direction between the base gas inlets, the diffusers tapering so that the dimension of each diffuser in the Y horizontal direction diminishes in the downstream direction to an edge downstream from the base gas outlets, at least some of the diffusers having additional gas inlets with openings at the edges of the diffusers.

2. A flow inlet element as claimed in claim 1 wherein each diffuser includes at least one coolant passage extending in the X direction within such diffuser, and wherein the structure includes a gas distribution channel extending in the X direction associated with each diffuser, the gas distribution channels being disposed upstream from the coolant passages and communicating with the additional gas inlets.

3. A flow inlet element as claimed in claim 2 wherein each diffuser has two coolant passages spaced apart from one another in the Y direction, and one or more connecting passages extending from the gas distribution channel associated with the diffuser to the opening of the additional gas inlet of the diffuser, the connecting passages of each diffuser extending between the coolant passages of such diffuser.

4. A flow inlet element as claimed in claim 3 wherein the structure defines an active region including the base gas inlets and additional gas inlets and one or more manifolds horizontally offset from the active region, at least some of the tubular elements extending to the one or more manifolds.

5. A flow inlet element as claimed in claim 2 wherein the structure includes a tubular element associated with each of the diffusers, the tubular element associated with each diffuser defining the gas distribution channel associated with such diffuser and structurally supporting such diffuser, the tubular elements extending parallel to one another in the X direction.

6. A flow inlet element as claimed in claim 5 wherein the base gas inlets extend between adjacent ones of the tubular elements.

\* \* \* \* \*